United States Patent
Yu

(10) Patent No.: US 6,475,890 B1
(45) Date of Patent: Nov. 5, 2002

(54) FABRICATION OF A FIELD EFFECT TRANSISTOR WITH AN UPSIDE DOWN T-SHAPED SEMICONDUCTOR PILLAR IN SOI TECHNOLOGY

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/789,939

(22) Filed: Feb. 12, 2001

(51) Int. Cl.[7] .............................................. H01L 21/44
(52) U.S. Cl. ..................... 438/574; 438/576; 438/578
(58) Field of Search ................................. 438/574, 576, 438/578

(56) References Cited

U.S. PATENT DOCUMENTS 5,929,525 A * 7/1999 Lin .............................. 257/758
5,977,579 A * 11/1999 Noble ......................... 257/302

OTHER PUBLICATIONS

Xuejue Huang et al., *Sub 50–nm FinFET: PMOS*, IEDM, 1999.

* cited by examiner

Primary Examiner—David Nelms
Assistant Examiner—Reneé R. Berry
(74) Attorney, Agent, or Firm—Monica H. Choi

(57) ABSTRACT

For fabricating a field effect transistor on a semiconductor substrate in SOI (semiconductor on insulator) technology, a pillar of semiconductor material is formed on a layer of buried insulating material. The pillar has a top surface and first and second side surfaces, and the pillar has a width, a length, and a height. A masking structure is formed on a center portion of the top surface of the pillar along the length of the pillar. A top portion of the height of the pillar is etched from exposed surfaces of the top surface of the pillar down to a bottom portion of the height of the pillar to form an upside down T-shape for the pillar. A gate dielectric material is deposited on any exposed surface of the semiconductor material of the pillar for a gate length along the length of the pillar. A gate electrode material is deposited on the gate dielectric material to surround the pillar for the gate length of the pillar. A drain and source dopant is implanted into exposed regions of the pillar to form a drain of the field effect transistor on a first side of the gate electrode material along the length of the pillar and to form a source of the field effect transistor on a second side of the gate electrode material along the length of the pillar. In this manner, for a given height and width of the semiconductor pillar, any point of a cross-section of such a pillar is more closely located to the gate bias applied at a surface of such a pillar to maximize effective drive current while minimizing undesired short channel effects of the field effect transistor.

14 Claims, 6 Drawing Sheets

US 6,475,890 B1

FABRICATION OF A FIELD EFFECT TRANSISTOR WITH AN UPSIDE DOWN T-SHAPED SEMICONDUCTOR PILLAR IN SOI TECHNOLOGY

TECHNICAL FIELD

The present invention relates generally to fabrication of field effect transistors having scaled-down dimensions, and more particularly, to fabrication of a field effect transistor with an upside down T-shaped semiconductor pillar in SOI (semiconductor on insulator) technology for minimizing short-channel effects and for maximizing drive current for the field effect transistor having scaled down dimensions of tens of nanometers.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension 104 and a source extension 106 formed within an active device area 126 of the semiconductor substrate 102. The drain extension 104 and the source extension 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where the MOSFET 100 is fabricated therein.

The MOSFET 100 also includes a spacer 122 disposed on the sidewalls of the gate electrode 118 and the gate dielectric 116. When the spacer 122 is comprised of silicon nitride ($Si_3N_4$), then a spacer liner oxide 124 is deposited as a buffer layer between the spacer 122 and the sidewalls of the gate electrode 118 and the gate dielectric 116.

As the dimensions of the MOSFET 100 are scaled down to tens of nanometers, short-channel effects degrade the performance of the MOSFET 100. Short-channel effects that result due to the short length of the channel between the drain extension 104 and the source extension 106 of the MOSFET 100 are known to one of ordinary skill in the art of integrated circuit fabrication. The electrical characteristics of the MOSFET 100 become difficult to control with bias on the gate electrode 118 with short-channel effects which may severely degrade the performance of the MOSFET.

Referring to FIG. 2, to enhance the control of electrical characteristics of a MOSFET 200, a three-sided gate electrode 202 is formed to surround a pillar 204 of semiconductor material for the MOSFET 200 formed with SOI (semiconductor on insulator) technology. FIG. 3 shows the cross sectional view of the three-sided gate electrode 202 across line A—A in FIG. 2. The pillar 204 of semiconductor material is formed on a layer of buried insulating material 206 on a semiconductor substrate 208 in SOI (semiconductor on insulator) technology, as known to one of ordinary skill in the art of integrated circuit fabrication. Typically, the semiconductor substrate 208 and the pillar 204 are comprised of silicon, and the three-sided gate electrode 202 is comprised of polysilicon. In addition, the layer of buried insulating material 206 is comprised of silicon dioxide ($SiO_2$).

A three-sided gate dielectric 210 is formed between the pillar 204 and the three sided gate electrode 202. The three-sided gate dielectric 210 is comprised of one of silicon dioxide ($SiO_2$), silicon nitride (Si3N4), or a dielectric material such as a metal oxide with a dielectric constant that is higher than the dielectric constant of silicon dioxide ($SiO_2$).

Referring to FIG. 2, a drain and source dopant is implanted into the pillar 204 at a first side of the three-sided gate electrode 202 to form a drain 212 of the MOSFET 200 and at a second side of the three-sided gate electrode 202 to form a source 214 of the MOSFET 200. A drain contact pad 216 is formed to provide connection to the drain 212 of the MOSFET 200, and a source contact pad 218 is formed to provide connection to the source 214 of the MOSFET 200.

Referring to FIGS. 2 and 3, the channel region of the MOSFET 200 is the gate length of the pillar 204 between the drain 212 and the source 214 and covered by the three-sided gate electrode 202. Because charge accumulation within such a channel region is controlled by bias on the gate electrode 202 on three surfaces of the pillar (instead of just the one top surface of the semiconductor substrate 102 in the conventional MOSFET of FIG. 1), electrical characteristics of the MOSFET 200 formed with SOI technology is more controllable to compensate for short-channel effects of the MOSFET 200.

However, the effective drive current width of the MOSFET 200 may be limited. FIG. 4 shows the cross-sectional view of the pillar 204 of FIG. 3 with the pillar 204 and the gate dielectric 210 enlarged. The drain to source current of the MOSFET 200 is proportional to the effective drive current width of the MOSFET 200. Referring to FIG. 4, the effective drive current width of the MOSFET 200 is the total perimeter distance of the gate dielectric 210 surrounding the pillar 204 including the height 220 of the pillar 204 for the first and second sides of the pillar 204 and the width 222 of the pillar 204 for the top surface of the pillar 204. If "H" denotes the height 220 of the pillar 204 and "W" denotes the width 222 of the pillar 204, then the effective drive current width "$W_{eff}$" of the MOSFET 200 is as follows:

$W_{eff}=W+2xH$

However, as the dimensions of the MOSFET 200 are scaled down for a smaller gate length of the pillar 204 from the drain contact 216 to the source contact 218, etching processes have aspect ratio limitations such that the height 220 of the pillar 204 is limited, as known to one of ordinary skill in the art of integrated circuit fabrication. With a limited height 220 of the pillar 204, the effective drive current width, $W_{\mathit{eff}}$, and in turn the speed performance of the MOSFET 200 are disadvantageously limited.

Nevertheless, fabrication of the MOSFET 200 in SOI (semiconductor on insulator) technology with formation of the three-dimensional pillar 204 having gate bias at a plurality of sides of the pillar 204 is desirable for minimizing undesired short-channel effects. Thus, a mechanism is desired for maximizing the effective drive current of a MOSFET formed with the three-dimensional pillar having gate bias at a plurality of sides of the pillar 204 in SOI (semiconductor on insulator) technology.

SUMMARY OF THE INVENTION

Accordingly, in a general aspect of the present invention, a pillar of semiconductor material is formed to have an upside down T-shape to maximize the effective drive current of a MOSFET. With such an upside down T-shape of the pillar, any point of a cross-section of such a pillar is more closely located to the gate bias applied at a surface of such a pillar such that the effective drive current of the MOSFET is maximized.

In one embodiment of the present invention, for fabricating a field effect transistor on a semiconductor substrate in SOI (semiconductor on insulator) technology, a pillar of semiconductor material is formed on a layer of buried insulating material. The pillar has a top surface and first and second side surfaces, and the pillar has a width, a length, and a height. A masking structure is formed on a center portion of the top surface of the pillar along the length of the pillar. A top portion of the height of the pillar is etched from exposed surfaces of the top surface of the pillar down to a bottom portion of the height of the pillar to form an upside down T-shape for the pillar. A gate dielectric material is deposited on any exposed surface of the semiconductor material of the pillar for a gate length along the length of the pillar. A gate electrode material is deposited on the gate dielectric material to surround the pillar for the gate length of the pillar. A drain and source dopant is implanted into exposed regions of the pillar to form a drain of the field effect transistor on a first side of the gate electrode material along the length of the pillar and to form a source of the field effect transistor on a second side of the gate electrode material along the length of the pillar.

In this manner, the gate dielectric material contacts more numerous surfaces of the semiconductor pillar. For a given height and width of the semiconductor pillar, any point of a cross-section of such a pillar is more closely located to the gate bias applied at a surface of such a pillar such that the effective drive current of the field effect transistor is maximized. In addition, since gate bias on the gate electrode is applied on the more numerous surfaces of the semiconductor pillar, the short-channel effects of the field effect transistor are minimized.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, and 17 refer to elements having similar structure and function.

DETAILED DESCRIPTION

Figure 5:
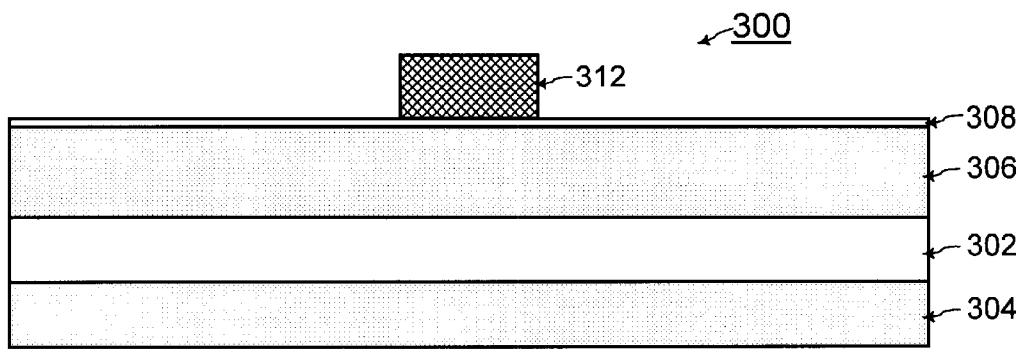
FIGS. 5, 6, 7, 8, 9, 10, 11, 12, 13, 14, 15, 16, and 17 show isometric and cross-sectional views for illustrating the steps for fabricating a MOSFET (Metal Oxide Semiconductor Field Effect Transistor) with a semiconductor pillar having an upside down T-shape such that gate bias is applied on more numerous surfaces of the semiconductor pillar to maximize the effective drive current width of the MOSFET while minimizing short-channel effects of the MOSFET, according to one embodiment of the present invention.

Referring to FIG. 5, for fabricating a MOSFET 300 in SOI (semiconductor on insulator) technology, a layer of buried insulating material 302 is formed on a semiconductor substrate 304. The semiconductor substrate 304 is typically comprised of silicon, and the layer of buried insulating material 302 is typically comprised of silicon dioxide ($SiO_2$). A layer of semiconductor material 306 for forming a pillar is deposited on the layer of buried insulating material 302. The layer of semiconductor material 306 is comprised of silicon according to an embodiment of the present invention. Processes for deposition of the layer of buried insulating material 302 and the layer of semiconductor material 306 are known to one of ordinary skill in the art of integrated circuit fabrication.

A layer of masking insulating material 308 is deposited on the layer of semiconductor material 306. In one embodiment of the present invention, the layer of masking insulating material 308 is comprised of silicon nitride ($Si_3N_4$). In that case, the layer of masking insulating material 308 has a thickness in a range of from about 20 Å (angstroms) to about 50 Å (angstroms) in an embodiment of the present invention. Processes for deposition of such a layer of masking insulating material 308 are known to one of ordinary skill in the art of integrated circuit fabrication.

Figure 6:
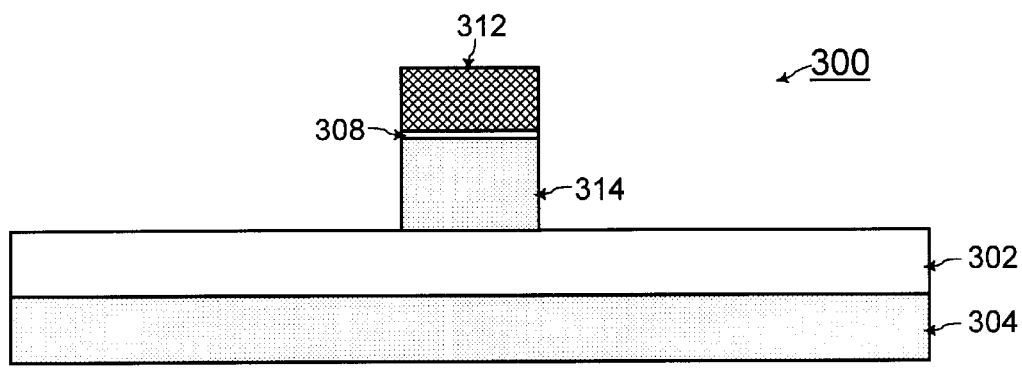

Further referring to FIG. 5, a layer of photoresist material is deposited and patterned to have a width and a length of a pillar to be formed from the layer of semiconductor material 306. Referring to FIGS. 5 and 6, any region of the layer of masking insulating material 308 and the layer of semiconductor material 306 not masked by the photoresist material 312 is etched away to form a pillar 314 of the semiconductor material 306. Processes for patterning and etching the layer of masking insulating material 308 and the layer of semiconductor material 306, such as an anisotropic plasma etching process, are known to one of ordinary skill in the art of integrated circuit fabrication.

Figure 7:
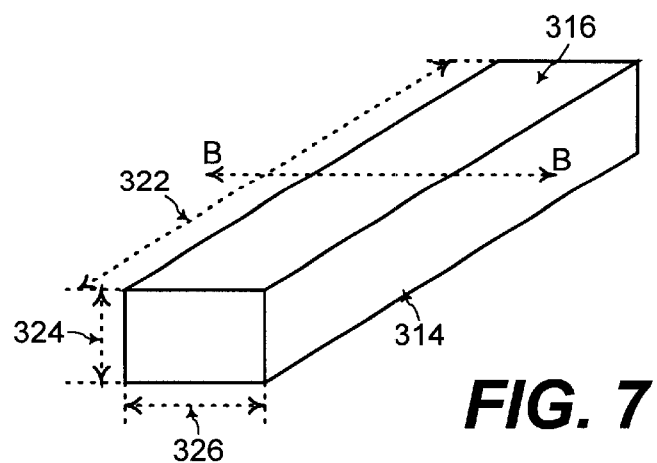

FIG. 7 shows an isometric view of the pillar of semiconductor material 314. Referring to FIGS. 6 and 7, the pillar 314 of the semiconductor material 306 has a top surface 316. The cross-sectional view of the pillar 314 of FIG. 6 is across the dashed line B—B in FIG. 7. Further referring to FIG. 7, the pillar 314 has a length 322, a height 324, and a width 326. In one embodiment of the present invention, the height 324 of the pillar 314 is in a range of from about 50 nanometers to about 160 nanometers, and the width 326 of the pillar 314 is in a range of from about 15 nanometers to about 40 nanometers.

Figure 8:
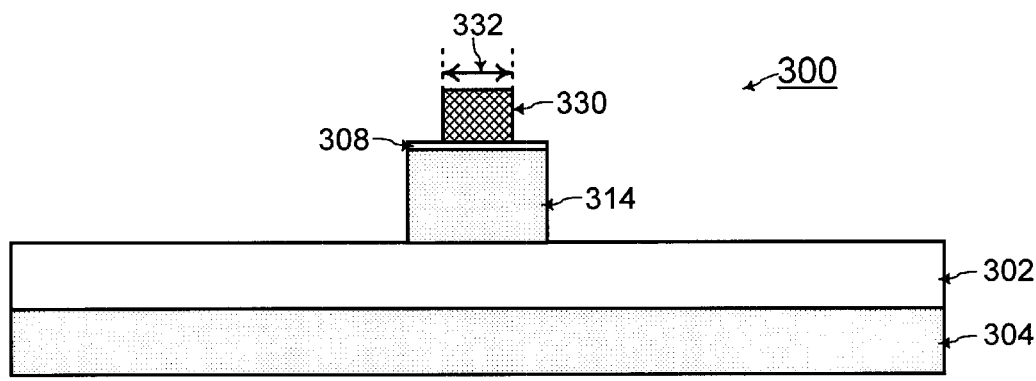
Figure 9:
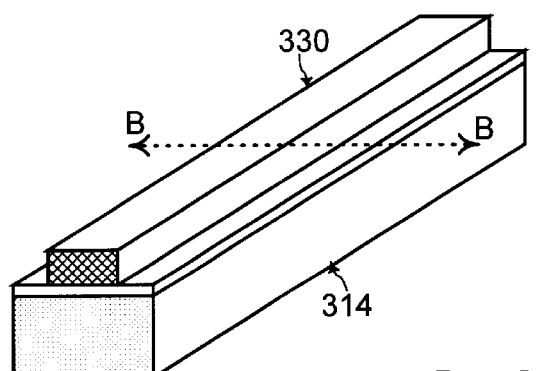

Referring to FIG. 6, the pillar 314 has the silicon nitride ($Si_3N_4$) of the layer of masking insulating material 308 remaining on the top surface 316 of the pillar 314. Referring to FIGS. 6 and 8, side portions the photoresist material 312 are etched away to form a masking structure 330 comprised of photoresist material on a center portion of the top surface of the pillar 314. The width 332 of the masking structure is between about 5 nanometers when the width 326 of the pillar 314 is about 15 nanometers and about 10 nanometers when the width 326 of the pillar 314 is about 40 nanometers, according to one embodiment of the present invention. FIG. 9 illustrates an isometric view of the cross-sectional view of FIG. 8, and the cross-sectional view of FIG. 8 is along line B—B of FIG. 9. Processes for etching away side portions of the photoresist material 312 to form the masking structure 330, such as a photoresist ashing process, are known to one of ordinary skill in the art of integrated circuit fabrication.

Figure 10:
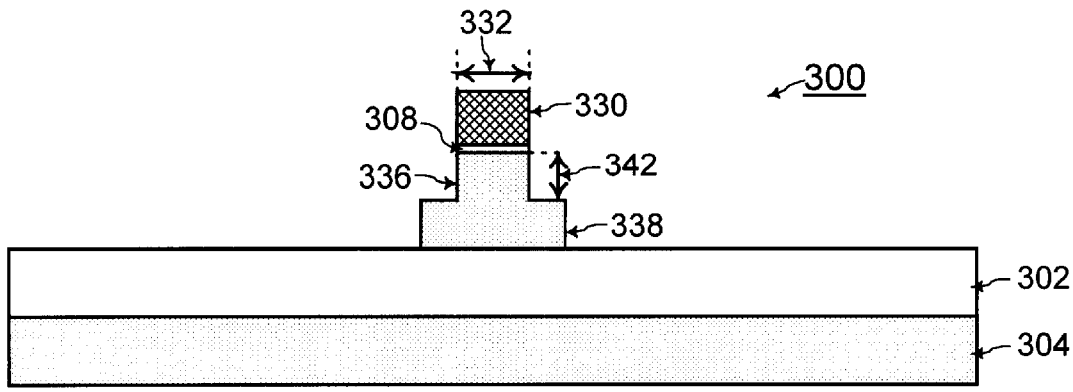

Referring to FIG. 10, a top portion 336 of the height of the pillar 314 is etched away from exposed surfaces of the of the top surface 316 of the pillar 314 down to a bottom portion 338 of the height of the pillar 314 to form an upside down T-shaped pillar 340. The layer of insulating material 308 and the top portion of the pillar 314 not under the masking structure 330 are etched down to the bottom portion 338 of the height of the pillar 314. The top portion 336 of the pillar 340 has a height 342 of between about 25 nanometers when the total height 324 of the pillar is about 50 nanometers and about 80 nanometers when the total height of the pillar 340 is about 160 nanometers. Processes for etching away the top portion 336 of the pillar 314 not covered by the masking structure 330, such as a timed etching process, are known to one of ordinary skill in the art of integrated circuit fabrication.

Figure 11:
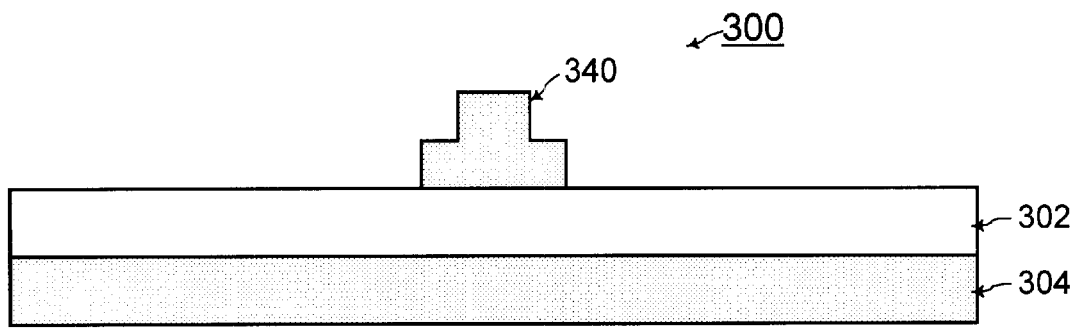
Figure 12:
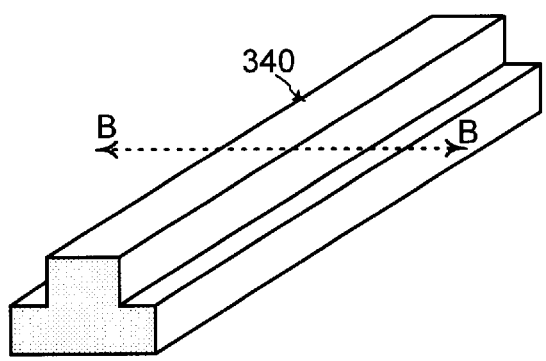

Referring to FIGS. 10 and 11, the photoresist material of the masking structure 330 and the silicon nitride ($Si_3N_4$) of the layer of masking insulating material 308 are removed from the upside down T-shaped pillar 340. FIG. 12 illustrates an isometric view of the upside down T-shaped pillar 340 of FIG. 11, and the cross-sectional view of FIG. 11 is along line B—B of FIG. 12. Processes for removing the photoresist material of the masking structure 330 and the silicon nitride ($Si_3N_4$) of the layer of masking insulating material 308 are known to one of ordinary skill in the art of integrated circuit fabrication.

Figure 13:
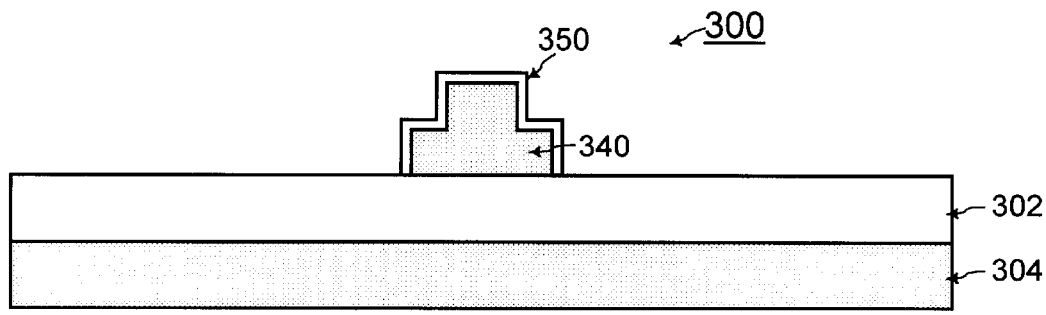

For forming the MOSFET 300 from the upside down T-shaped pillar 340, referring to FIG. 13, a gate dielectric material 350 is deposited on any exposed surfaces of the pillar 340. The gate dielectric material 350 may be comprised of one of silicon dioxide ($SiO_2$) or silicon nitride ($Si_3N_4$) in one embodiment of the present invention. In another embodiment of the present invention, the gate dielectric material 350 is comprised of a material such as a metal oxide that has a dielectric constant that is higher than the dielectric constant of silicon dioxide ($SiO_2$). In that case, the gate dielectric material 350 has a higher thickness than if the gate dielectric material 350 were comprised of silicon dioxide ($SiO_2$) to minimize undesired tunneling current through the gate dielectric material 350. Processes for deposition of such gate dielectric material 350 are known to one of ordinary skill in the art of integrated circuit fabrication.

Figure 14:
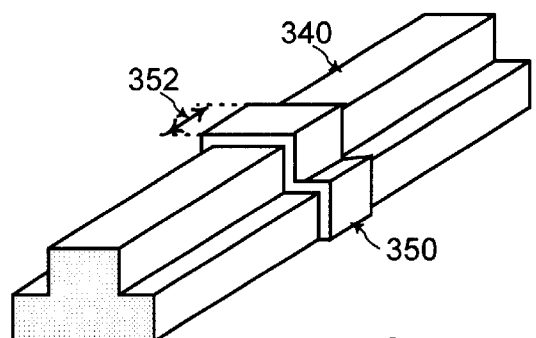

FIG. 14 illustrates an isometric view of the gate dielectric material 350 formed on the upside down T-shaped pillar 340 in FIG. 13. Referring to FIG. 14, the gate dielectric material 350 is formed to cover any exposed surfaces of the pillar 340 along a gate length 352 of the total length 322 of the pillar 340. Processes for forming such a gate dielectric material 350 are known to one of ordinary skill in the art of integrated circuit fabrication.

Figure 15:
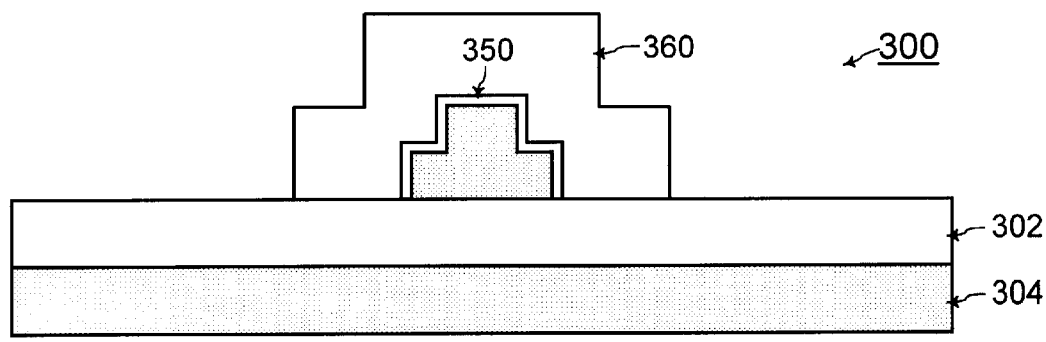

Referring to FIG. 15, a gate electrode material 360 is deposited on the gate dielectric material 350 to surround the pillar 340 along the gate length 352 of the pillar 340. According to one embodiment of the present invention, the gate electrode material 360 is comprised of one of poly-silicon, poly-silicon germanium (SiGe), or a metal. Processes for deposition of such gate electrode material 360 are known to one of ordinary skill in the art of integrated circuit fabrication.

Figure 16:
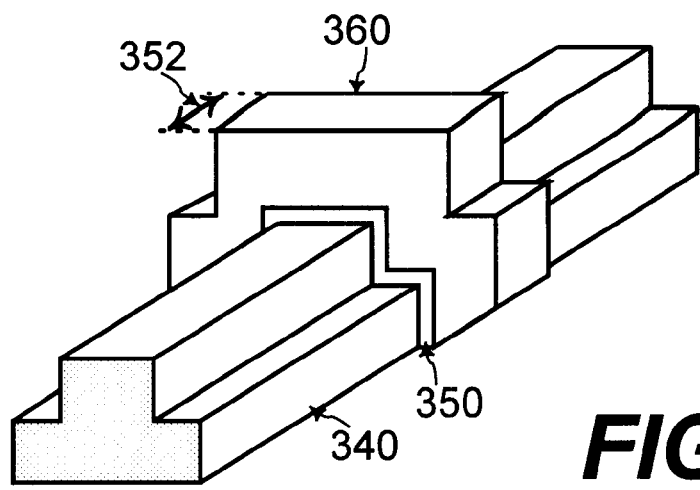

FIG. 16 shows an isometric view of the pillar 340 with the gate dielectric material 350 and the gate electrode material 360 patterned to surround the pillar 340 for the gate length 352 of the total length 322 of the pillar 340. Processes for forming such a gate electrode material 360 are known to one of ordinary skill in the art of integrated circuit fabrication. The remaining length of the pillar 340 not surrounded by the gate electrode material 360 is exposed.

Figure 17:
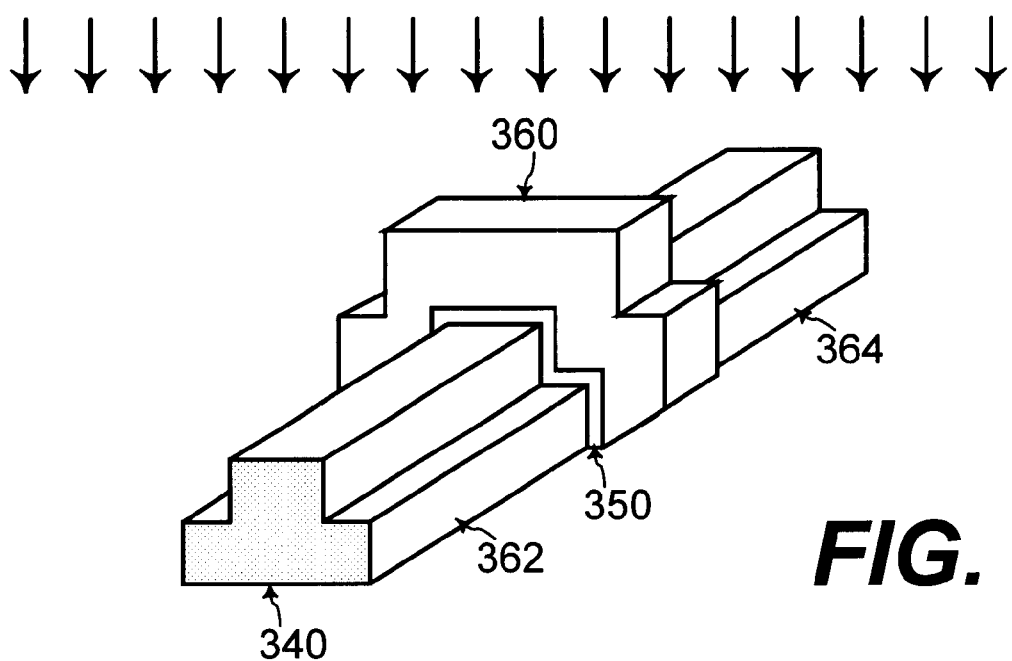

Further referring to FIG. 17, a drain and source dopant is implanted into the exposed regions of the pillar 340 to form a drain 362 of the MOSFET 300 at a first side of the gate electrode material 360 along the length 322 of the pillar 340 and to form a source 364 of the MOSFET 300 at a second side of the gate electrode material 360 along the length 322 of the pillar 340. The drain and source dopant is an N-type dopant for forming the drain 362 and the source 364 of an NMOSFET (N-channel Metal Oxide Semiconductor Field Effect Transistor). Alternatively, the drain and source dopant is a P-type dopant for forming the drain 362 and the source 364 of a PMOSFET (P-channel Metal Oxide Semiconductor Field Effect Transistor). Processes for implantation of the drain and source dopant for formation of the drain 362 and the source 364 of the MOSFET 300 are known to one of ordinary skill in the art of integrated circuit fabrication.

Figure 1:
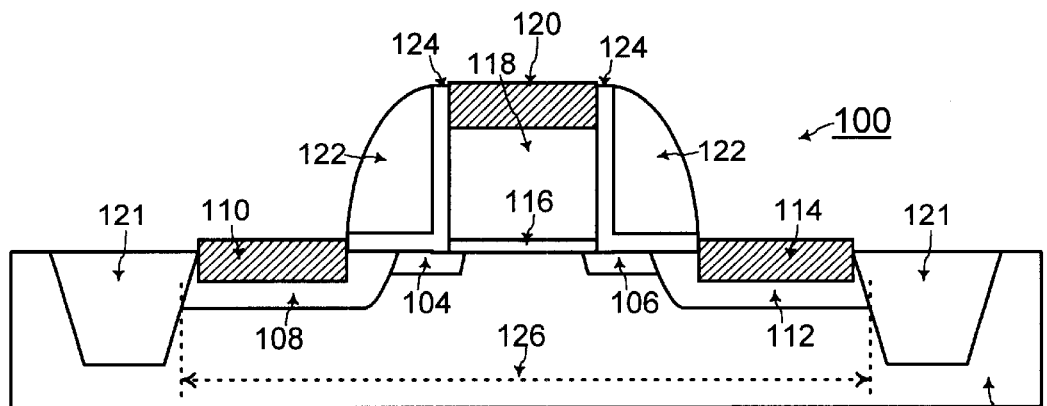
FIG. 1 shows a cross-sectional view of a conventional MOSFET (Metal Oxide Semiconductor Field Effect Transistor) with the gate electrode disposed over a single surface of the semiconductor substrate.
Figure 2:
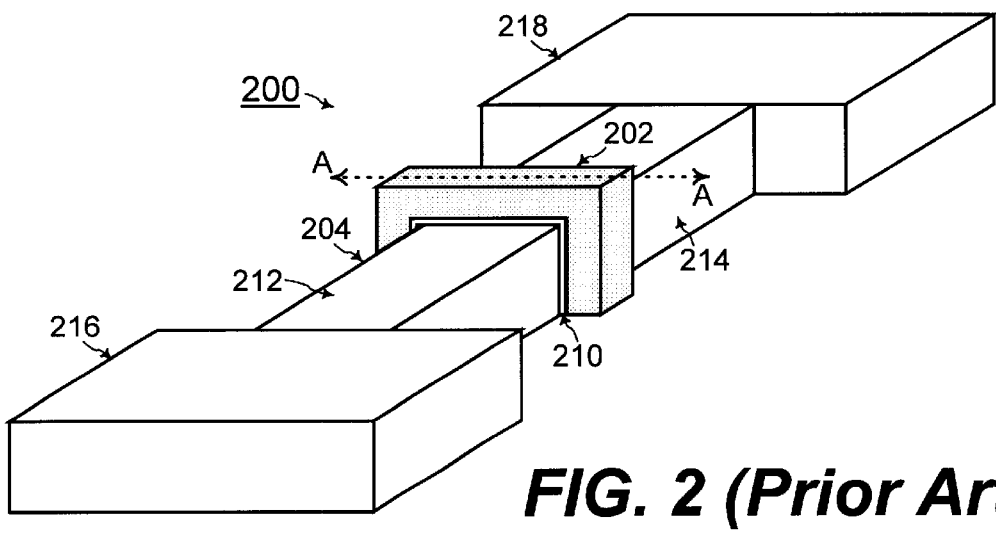
FIG. 2 shows an isometric view of a MOSFET (Metal Oxide Semiconductor Field Effect Transistor) fabricated in SOI (semiconductor on insulator) technology with a three-sided gate electrode surrounding three surfaces of a silicon pillar, according to the prior art.
Figure 3:
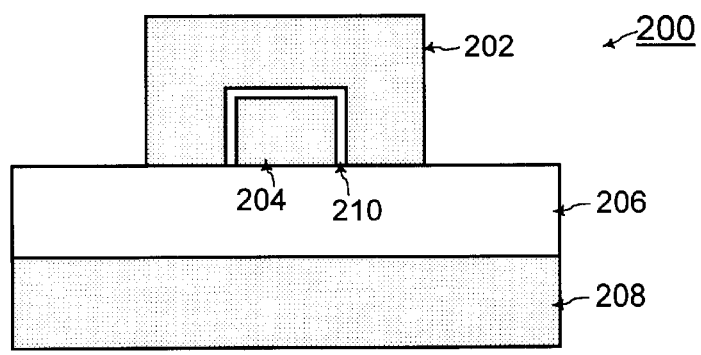
FIG. 3 shows a cross sectional view of the three-sided gate electrode surrounding three surfaces of the silicon pillar of FIG. 2, according to the prior art.
Figure 4:
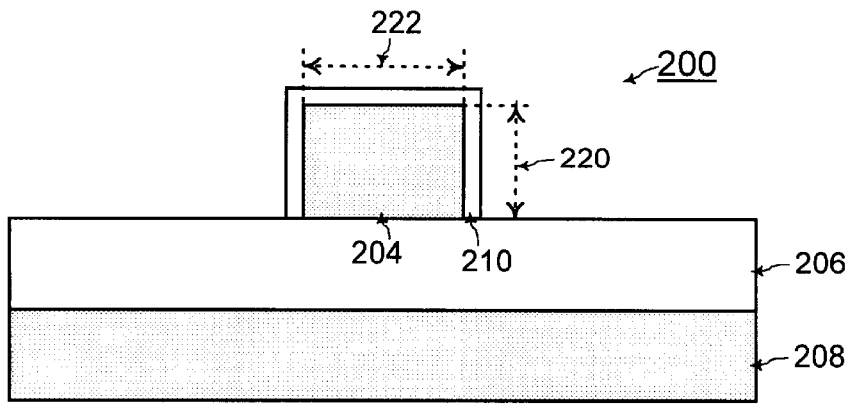
FIG. 4 shows the cross sectional view of FIG. 3 with a three-sided gate dielectric surrounding the three surfaces of the silicon pillar of FIG. 3 for illustrating that the effective drive current width of the MOSFET is limited by the height of the silicon pillar, according to the prior art.

In this manner, since gate bias on the gate electrode 360 is applied on the more numerous surfaces for the upside down T-shaped pillar 340 (than for the prior art three sided pillar 214 of FIG. 2), charge accumulation in the channel region of the MOSFET 300 is more controlled such that the short-channel effects of the MOSFET 300 are minimized. In addition, for a given height and width of the semiconductor pillar, any point of a cross-section of the upside down T-shaped pillar 340 is more closely located to the gate bias applied at a surface of such a pillar 340 such that the effective drive current of the field effect transistor is maximized. Furthermore, because the MOSFET 300 is formed with SOI (semiconductor on insulator) technology, junction capacitance is eliminated to further enhance the speed performance of the MOSFET.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "top," "upside down," "bottom," and "on" as used herein refer to relative location and orientation of various portions of the structures with respect to one another, and are not intended to suggest that any particular absolute orientation with respect to external objects is necessary or required. The present invention is limited only as defined in the following claims and equivalents thereof.

I claim:

1. A method for fabricating a field effect transistor on a semiconductor substrate in SOI (semiconductor on insulator) technology, the method including the steps of:

A. forming a pillar of semiconductor material on a layer of buried insulating material, wherein said pillar has a top surface and first and second side surfaces, and wherein said pillar has a width, a length, and a height;

B. forming a masking structure on a center portion of said top surface of said pillar along said length of said pillar;

C. etching a top portion of said height of said pillar from exposed surfaces of said top surface of said pillar down to a bottom portion of said height of said pillar to form an upside down T-shape for said pillar;

D. removing said masking structure from said top of said pillar to expose said top surface of said upside down T-shaped pillar;

E. depositing a gate dielectric material on any exposed surface of said semiconductor material of said upside down T-shaped pillar for a gate length along said length of said upside down T-shaped pillar;

wherein said semiconductor material of said upside down T-shaped pillar adjacent said gate dielectric material forms a channel region of said field effect transistor;

F. depositing a gate electrode material on said gate dielectric material to surround said upside down T-shaped pillar for said gate length of said upside down T-shaped pillar; and G. implanting a drain and source dopant into exposed regions of said upside down T-shaped pillar to form a drain of said field effect transistor on a first side of said gate electrode material along said length of said upside down T-shaped pillar and to form a source of said field effect transistor on a second side of said gate electrode material along said length of said upside down T-shaped pillar.

2. The method of claim 1, wherein said step A includes the steps of:

depositing said layer of buried insulating material on said semiconductor substrate;

depositing a layer of said semiconductor material of said pillar on said layer of buried insulating material;

depositing a layer of masking insulating material on said layer of semiconductor material;

patterning and etching a layer of photoresist material to mask said layer of masking insulating material and said layer of said semiconductor material of said pillar for said width and said length of said pillar; and etching any region of said layer of masking insulating material and said layer of said semiconductor material of said pillar not masked by said photoresist material to form said pillar of said semiconductor material with said masking insulating material on said top surface of said pillar.

3. The method of claim 2, wherein said step B includes the steps of:

ashing away side portions of said photoresist material remaining on said layer of masking insulating material to form said masking structure of said photoresist material over said center portion of said pillar.

4. The method of claim 3, wherein said step C includes the step of:

etching any region of said layer of masking insulating material and said layer of said semiconductor material of said pillar not masked by said photoresist material down to said bottom portion of said height of said pillar to form said upside down T-shape for said pillar; and removing said masking structure and said masking insulating material from said top surface of said pillar to expose said top surface of said pillar.

5. The method of claim 2, wherein said layer of masking insulating material is comprised of silicon nitride ($Si_3N_4$) having a thickness in a range of from about 20 nanometers to about 50 nanometers.

6. The method of claim 1, wherein said semiconductor material of said pillar is silicon.

7. The method of claim 1, wherein said height of said semiconductor pillar is in a range of from about 50 nanometers to about 160 nanometers, and wherein said width of said semiconductor pillar is in a range of from about 15 nanometers to about 40 nanometers.

8. The method of claim 7, wherein a width of said masking structure over said center portion of said pillar is in a range of from about 5 nanometers to about 10 nanometers.

9. The method of claim 7, wherein said top portion of said height of said pillar etched down in said step C is between about 25 nanometers when said height of said pillar is about 50 nanometers and about 80 nanometers when said height of said pillar is about 160 nanometers.

10. The method of claim 1, wherein said gate dielectric material is comprised of one of silicon dioxide ($SiO_2$), silicon nitride ($Si_3N_4$), or a high dielectric constant material having a dielectric constant that is higher than the dielectric constant of silicon dioxide ($SiO_2$).

11. The method of claim 1, wherein said gate electrode material is comprised of one of poly-silicon, poly-silicon germanium (SiGe), or a metal.

12. The method of claim 1, wherein said drain and source dopant is an N-type dopant for fabrication of an NMOSFET (N-channel Metal Oxide Semiconductor Field Effect Transistor).

13. The method of claim 1, wherein said drain and source dopant is a P-type dopant for fabrication of a PMOSFET (P-channel Metal Oxide Semiconductor Field Effect Transistor).

14. A method for fabricating a MOSFET (metal oxide semiconductor field effect transistor) on a semiconductor substrate in SOI (semiconductor on insulator) technology, the method including the steps of:

A. forming a pillar of semiconductor material on a layer of buried insulating material, wherein said pillar has a top surface and first and second side surfaces, and wherein said pillar has a width, a length, and a height, said step A further including the steps of:

depositing said layer of buried insulating material on said semiconductor substrate;

depositing a layer of said semiconductor material of said pillar on said layer of buried insulating material;

depositing a layer of masking insulating material on said layer of semiconductor material;

wherein said layer of masking insulating material is comprised of silicon nitride ($Si_3N_4$) having a thickness in a range of from about 20 nanometers to about 50 nanometers;

patterning and etching a layer of photoresist material to mask said layer of masking insulating material and said layer of said semiconductor material of said pillar for said width and said length of said pillar; and etching any region of said layer of masking insulating material and said layer of said semiconductor material of said pillar not masked by said photoresist material to form said pillar of said semiconductor material with said masking insulating material on said top surface of said pillar;

wherein said semiconductor material of said pillar is silicon, and wherein said height of said semiconductor pillar is in a range of from about 50 nanometers to about 160 nanometers, and wherein said width of said semiconductor pillar is in a range of from about 15 nanometers to about 40 nanometers;

B. forming a masking structure on a center portion of said top surface of said pillar along said length of said pillar, said step B further including the step of:

ashing away side portions of said photoresist material remaining on said layer of masking insulating material to form said masking structure of said photoresist material over said center portion of said pillar;

wherein a width of said masking structure over said center portion of said pillar is in a range of from about 5 nanometers to about 10 nanometers;

C. etching a top portion of said height of said pillar from exposed surfaces of said top surface of said pillar down to a bottom portion of said height of said pillar to form an upside down T-shape for said pillar, said step C further including the step of:

etching any region of said layer of masking insulating material and said layer of said semiconductor material of said pillar not masked by said photoresist material down to said bottom portion of said height of said pillar to form said upside down T-shape for said pillar;

wherein said top portion of said height of said pillar etched down in said step C is between about 25 nanometers when said height of said pillar is about 50 nanometers and about 80 nanometers when said height of said pillar is about 160 nanometers;

D. removing said masking structure and said masking insulating material from said top surface of said pillar to expose said top surface of said upside down T-shaped pillar;

E. depositing a gate dielectric material on any exposed surface of said semiconductor material of said upside down T-shaped pillar for a gate length along said length of said upside down T-shaped pillar;

wherein said gate dielectric material is comprised of one of silicon dioxide ($SiO_2$), silicon nitride ($Si_3N_4$), or a high dielectric constant material having a dielectric constant that is higher than the dielectric constant of silicon dioxide ($SiO_2$);

and wherein said semiconductor material of said upside down T-shaped pillar adjacent said gate dielectric material forms a channel region of said field effect transistor;

F. depositing a gate electrode material on said gate dielectric material to surround said upside down T-shaped pillar for said gate length of said pillar;

wherein said gate electrode material is comprised of one of poly-silicon, poly-silicon germanium (SiGe), or a metal; and G. implanting a drain and source dopant into exposed regions of said upside down T-shaped pillar to form a drain of said MOSFET on a first side of said gate electrode material along said length of said upside down T-shaped pillar and to form a source of said MOSFET on a second side of said gate electrode material along said length of said upside down T-shaped pillar;

wherein said drain and source dopant is an N-type dopant for fabrication of an NMOSFET (N-channel Metal Oxide Semiconductor Field Effect Transistor);

and wherein said drain and source dopant is a P-type dopant for fabrication of a PMOSFET (P-channel Metal Oxide Semiconductor Field Effect Transistor).

* * * * *